(12) United States Patent
Pranatharthiharan et al.

(10) Patent No.: US 9,337,094 B1
(45) Date of Patent: May 10, 2016

(54) METHOD OF FORMING CONTACT USEFUL IN REPLACEMENT METAL GATE PROCESSING AND RELATED SEMICONDUCTOR STRUCTURE

(71) Applicant: International Business Machines Corporation, Armonk, NY (US)

(72) Inventors: Balasubramanian Pranatharthiharan, Watervliet, NY (US); Injo Ok, Loudonville, NY (US); Charan V. V. S. Surisetty, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/589,222

(22) Filed: Jan. 5, 2015

(51) Int. Cl.
*H01L 29/78* (2006.01)
*H01L 21/768* (2006.01)
*H01L 29/66* (2006.01)
*H01L 29/417* (2006.01)

(52) U.S. Cl.
CPC .... *H01L 21/76897* (2013.01); *H01L 21/76831* (2013.01); *H01L 21/76843* (2013.01); *H01L 29/41775* (2013.01); *H01L 29/66545* (2013.01); *H01L 29/66553* (2013.01)

(58) Field of Classification Search
CPC . H01L 21/3205; H01L 21/8238; H01L 29/78; H01L 29/511
See application file for complete search history.

(56) References Cited

U.S. PATENT DOCUMENTS

| | | | |
|---|---|---|---|
| 6,274,426 B1 | 8/2001 | Lee et al. | |
| 6,297,110 B1 | 10/2001 | Chan et al. | |
| 6,369,430 B1 | 4/2002 | Adetutu et al. | |
| 7,056,828 B2 | 6/2006 | Chung et al. | |
| 7,067,364 B1 | 6/2006 | Lee | |
| 7,888,252 B2 | 2/2011 | Faltermeier et al. | |
| 2001/0010961 A1 | 8/2001 | Jung et al. | |
| 2005/0167763 A1* | 8/2005 | Kuan | H01L 21/76897 257/396 |
| 2010/0210098 A1 | 8/2010 | Faltermeier et al. | |

* cited by examiner

*Primary Examiner* — Kyoung Lee
(74) *Attorney, Agent, or Firm* — Steven J. Meyers; Hoffman Warnick LLC

(57) ABSTRACT

A method of forming a contact is provided. The method may include forming a liner against a spacer around a gate; selectively removing an upper portion of the liner adjacent the spacer, forming a void; forming a spacer extension by filling the void with a spacer material; and forming a contact self-aligned to the spacer extension. A semiconductor structure is also disclosed. The structure may include: a gate; a spacer around the gate; a spacer extension extending laterally from an upper portion of the spacer; and a contact self-aligned to the spacer extension.

19 Claims, 10 Drawing Sheets

METHOD OF FORMING CONTACT USEFUL IN REPLACEMENT METAL GATE PROCESSING AND RELATED SEMICONDUCTOR STRUCTURE

BACKGROUND

1. Technical Field

The present invention relates to forming a contact in semiconductor fabrication, and more specifically, to a method for forming a contact useful for ensuring uniform gate height in replacement metal gate applications.

2. Related Art

During semiconductor fabrication, transistors are formed in a semiconductor substrate. Each transistor includes a gate through which a current can be passed to change the conductivity parameters within the semiconductor substrate. One approach to forming gates includes replacement metal gate (RMG) processing. RMG processing includes generating a number of sacrificial or dummy gates over a structure, such as a fin for a fin field effect transistor (FINFET), so that other processing steps, such as adjacent contact creation, can be carried out without damaging the gate. Once the other processing is carried out, the dummy gates are replaced with a metal to create the final metal gate structure. One challenge of using RMG processing is that it requires the use of multiple chemical-mechanical polishing (CMP) steps. CMP is a method of removing layers of solid by chemical-mechanical polishing carried out for the purpose of surface planarization and definition of metal interconnect patterns.

One challenge related to the CMP during RMG processing is controlling gate height. In one setting, improper gate height can be caused by dishing defects during CMP to expose a top portion of the dummy gates prior to their removal. Dishing defects generally include unwanted removal of portions of material about the dummy gates. Dishing defects can be created by the material being polished being too soft, e.g., poor quality oxide, or the CMP slurry being over-aggressive. Dishing defects can take the form of micro-dishing, which may create concavities within the dummy gate and adjacent spacers due to a high polishing rate of the dummy gate. In this case, deposition of sufficient metal to form the metal gates with the desired height may require additional polishing to remove the concavities and achieve a planar surface. As a result of the additional planarization required, gate height may be lost. Dishing defects can also take the form of macro-dishing, which may occur within the ILD between dummy gates, creating large concavities in the ILD due, for example, to a high polishing rate of the ILD. In this case, deposition of metal, e.g., tungsten (W), to form the metal gates at the desired height also creates metal puddles in the large concavities in the ILD between the gates. As a consequence, additional polishing must be performed to remove the metal puddles, possibly sacrificing gate height in the process.

With further regard to the macro-dishing, the concavities in the ILD may also create issues for processing after the metal deposition to form the metal gates. In particular, after metal deposition, the metal gates may be recessed and the recess filled with a self-aligned contact (SAC) nitride cap for use in creating self-aligned contacts adjacent to the gate to the underlying substrate. Deposition of the SAC nitride cap may also fill any remaining concavity in the ILD, which can create a number of issues. For example, under-polishing after SAC nitride cap formation may leave SAC nitride cap residue on the ILD where the concavity existed that may prevent a subsequent contact open etch reaching the underlying substrate. That is, the SAC nitride cap residue requires a longer etch period, preventing certain locations from opening to the underlying substrate. Alternatively, over-polishing of the SAC nitride cap may not leave enough of the cap to establish isolated contact openings adjacent to the gate. In this case, the contact opening etch may expose a corner of the gate, causing a short of the subsequently formed contact with the gate.

SUMMARY

A first aspect of the invention is directed to a method of forming a contact, comprising: forming a liner against a spacer around a gate; selectively removing an upper portion of the liner adjacent the spacer, forming a void; forming a spacer extension by filling the void with a spacer material; and forming a contact self-aligned to the spacer extension.

A second aspect of the invention includes a method, comprising: forming a liner against a spacer around a dummy gate; removing the dummy gate; forming a metal gate in place of the dummy gate; selectively removing an upper portion of the liner adjacent the spacer, forming a void; forming a spacer extension by filling the void with a spacer material; and forming a contact self-aligned to the spacer extension.

A third aspect of the invention related to a semiconductor structure comprising: a gate; a spacer around the gate; a spacer extension extending laterally from an upper portion of the spacer; and a contact self-aligned to the spacer extension.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

Figure 1:
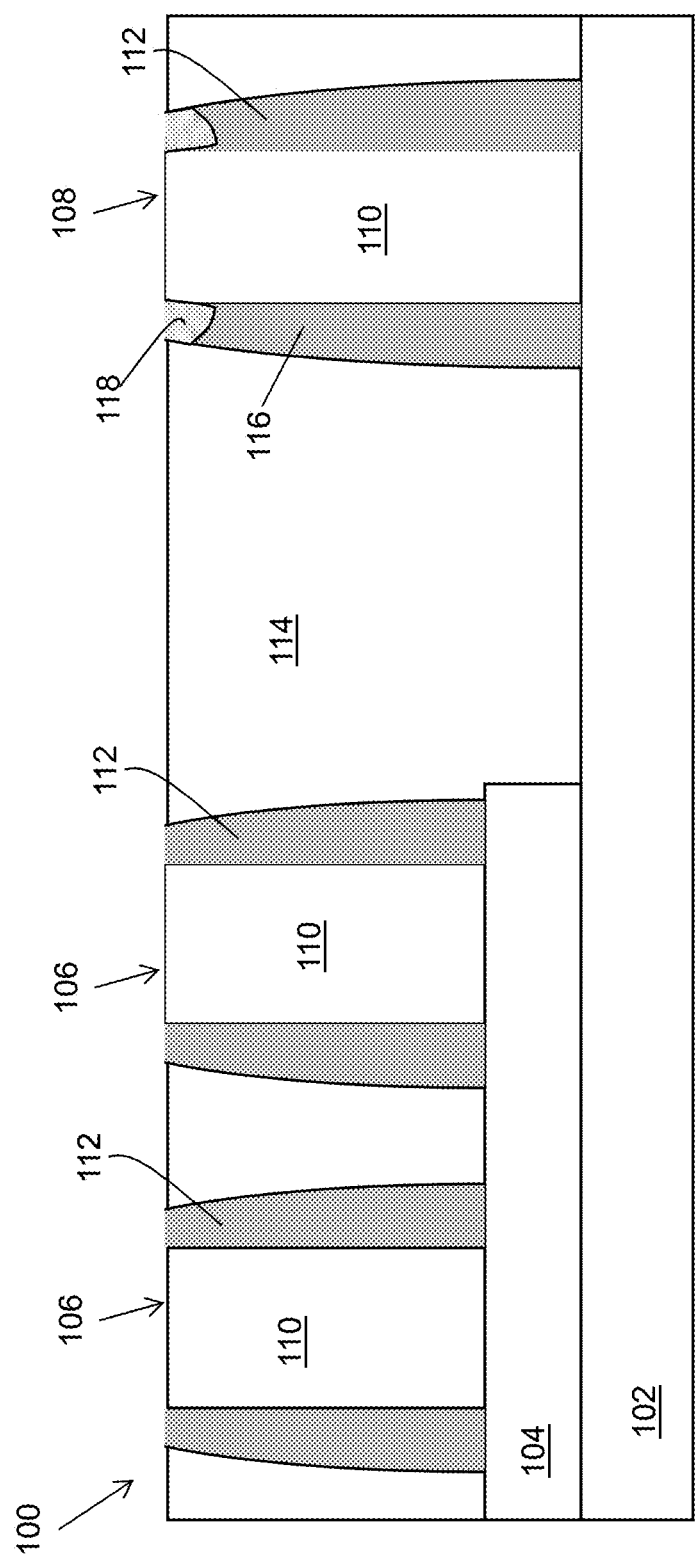
FIG. 1 shows a cross-section of an initial semiconductor structure upon which a method according to embodiments of the invention is applied.

Referring to the drawings, a method of forming a contact useful for protecting gate height in replacement metal gate (RMG) processing is illustrated. A semiconductor structure formed using the method is also described. While embodiments of the method will be described relative to RMG processing, it is emphasized that the contact forming method may find application other than with RMG processing.

FIG. 1 shows an initial semiconductor structure 100 that has undergone preliminary steps leading up to the methods according to embodiments of the invention. Structure 100 may include a substrate 102 having a plurality of fins 104 (stacked into page). Substrate 102 and/or fins 104 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. Substrate 102 and fins 104 may be the same material or different material. Fins 104 can be formed using any now known or later developed technique.

Semiconductor structure 100 also includes a plurality of gates 106 and 108. In the description, gates 106, 108 will be described as dummy gates (also referred to as "sacrificial gates") in a replacement metal gate (RMG) processing setting. It is emphasized, however, that the teachings of the invention may be applied to non-dummy gates, e.g., polysilicon gates. That is, the invention has applicability beyond just RMG applications as will be apparent to those with skill in the art.

As understood, gates 106, 108 implemented as dummy gates may include a sacrificial material 110 adjacent to which a spacer 112 is formed. Substrate 102 may include doped regions (not shown) that may constitute the other parts of a transistor. An interlayer dielectric (ILD) layer 114 may be deposited over gates 106, 108. Gates 106, 108 in the form of dummy gates allow other processing steps, as will be described, such as adjacent contact creation, to be carried out without damaging an eventual metal gate that will replace the dummy gate. Gates 106 are formed over fin(s) 104, and gate 108 is formed directly over substrate 102. Sacrificial material 110 may include any now known or later developed material capable of withstanding the processing to which it is exposed, such as but not limited to silicon nitride, any oxide, polysilicon, etc. Spacers 112 may include any conventional spacer material such as but not limited SiOCN, SiBCN, SiCN, $Si_3N_4$. Gates 106, 108 in the form of dummy gates may be formed using any now known or later developed semiconductor processing techniques, e.g., deposition of polysilicon, patterning and etching thereof, deposition of silicon nitride, etching thereof, etc. ILD layer 114 may be deposited thereover and polishing performed, e.g., chemical mechanical polishing (CMP) to planarized the structure. Although a certain number of gates have been illustrated, it is understood that many more gates may be present.

"Depositing," as used herein, may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HD-PCVD), rapid thermal CVD (RTCVD), ultra-high vacuum CVD (UHVCVD), limited reaction processing CVD (LR-PCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

In one embodiment, ILD layer 114 may include a flowable chemical vapor deposited (FCVD) oxide, e.g., silicon oxide ($SiO_2$). However, ILD layer 114 may include other materials such as but not limited to: silicon nitride ($Si_3N_4$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

While spacers 112 are illustrated as unitary entities relative to gates 106, spacers 112 may also include multi-part structures. For example, as shown on gate 108 in FIG. 1 only, each spacer 112 may include a base spacer 116 and a secondary spacer 118 atop the base spacer. Base spacer 116 and secondary spacer 118 may be formed for each dummy gate 106, 108 by, for example, recessing base spacer 116, filling the recesses in the spacer with, for example, an PECVD silicon nitride or thermal deposited silicon nitride 118, and recessing/planarizing the silicon nitride to arrive at the mult-part structure as shown on dummy gate 108.

Figure 2:
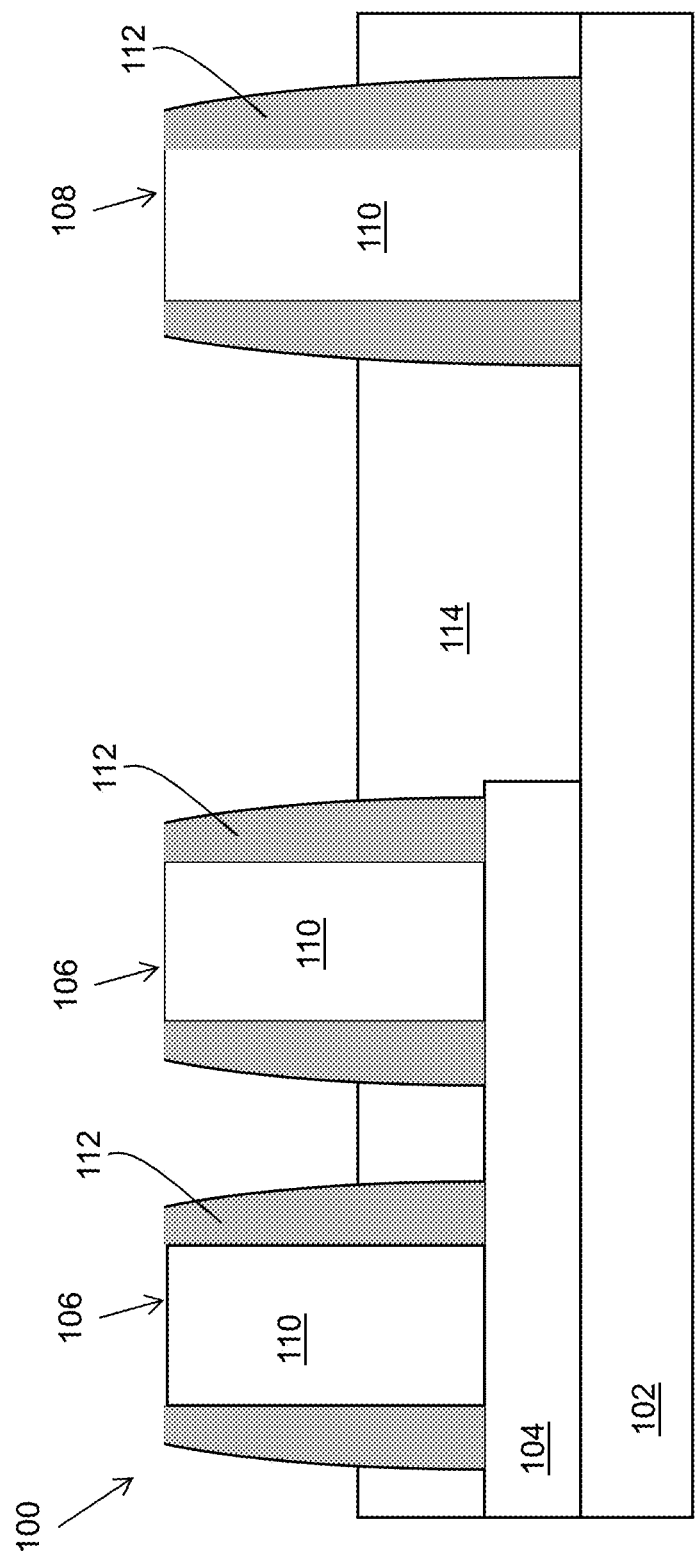
FIGS. 2-9 show cross-sections of the semiconductor structure illustrated steps of a method according to embodiments of the invention.

As illustrated in FIG. 2, ILD layer 114 is recessed, e.g., by a reactive ion etch (RIE), to expose an upper portion of dummy gates 106, 108.

Figure 3:
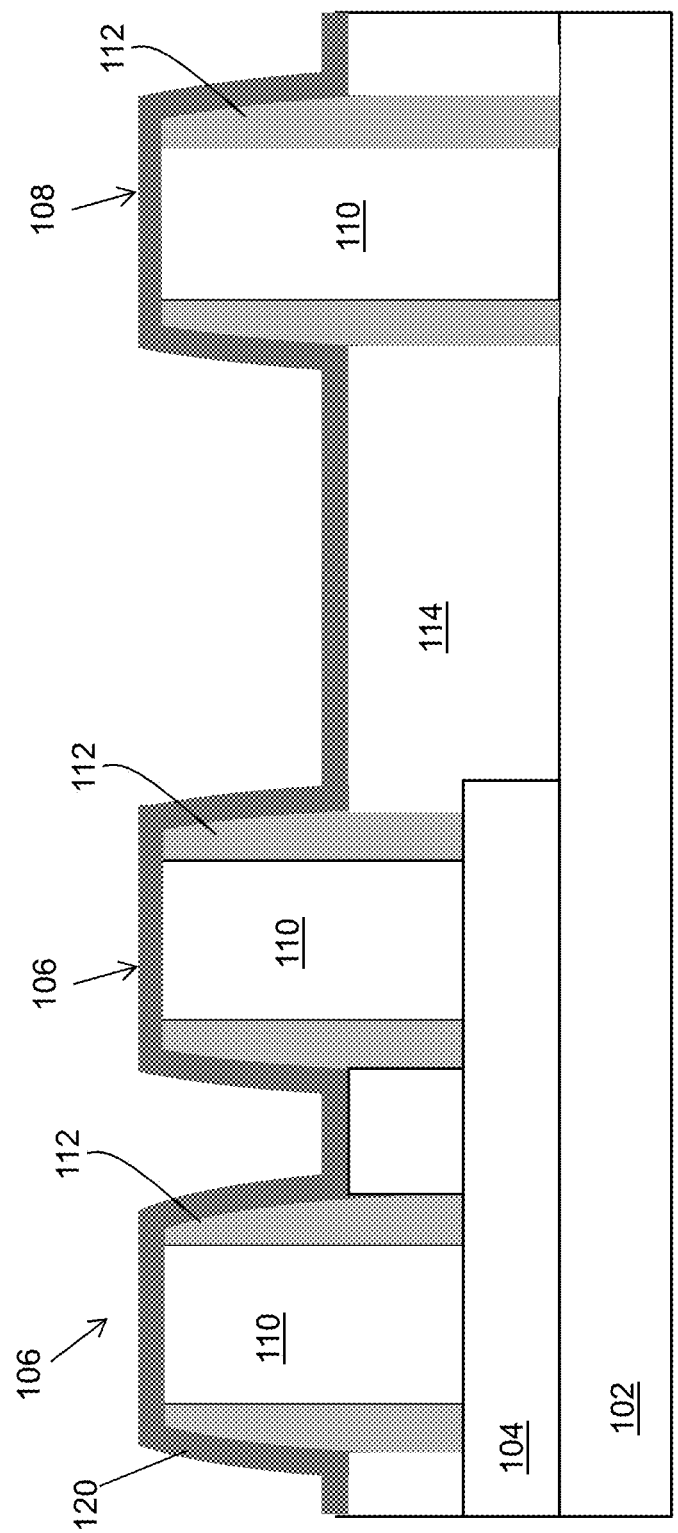

In accordance with embodiments of the invention, FIG. 3 shows forming a liner 120 against spacer 112 around gate 106, 108. Liner 120 may include a high dielectric constant (high-k) dielectric, titanium nitride (TiN) or tantalum nitride (TaN). Examples of high-k dielectric material include but are not limited to metal oxides, tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). Other high-k dielectrics may include, for example, $Dy_2O_3$, $La_2O_3$, $Y_2O_3$, $Yb_2O_3$, $Gd_2O_3$, $Be_2O_3$ or SiON. As illustrated, liner 120 may also extend over ILD layer 114 between gates 106 and between gates 106 and 108. As will become apparently, as illustrated only in FIG. 5 in phantom, liner 120 could be removed between the gates, if desired, e.g., by etching. Alternatively, liner 120 may be formed only in desired regions rather than across all gates 106, 108, e.g., over only gates 106.

Figure 4:
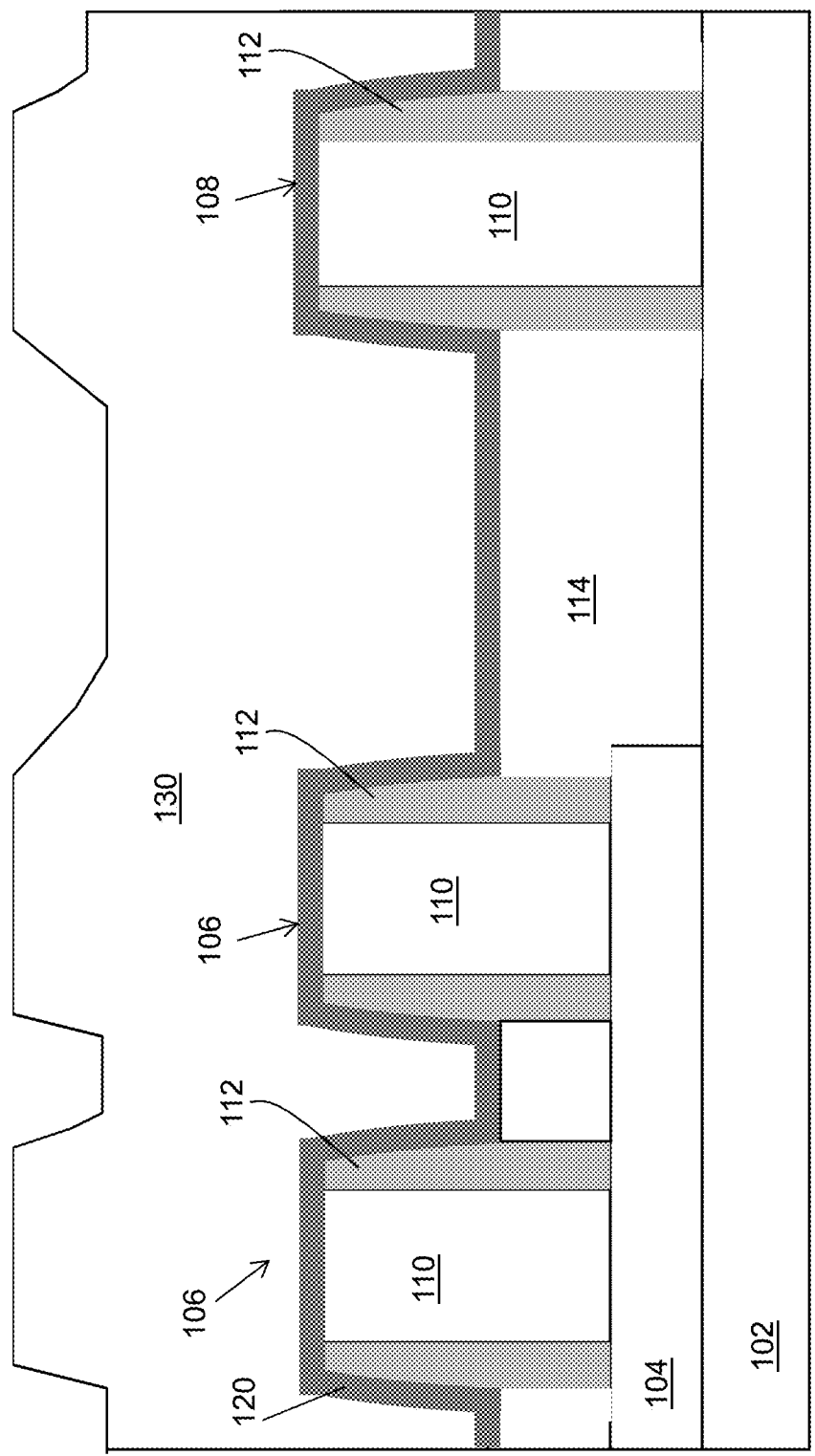
Figure 5:
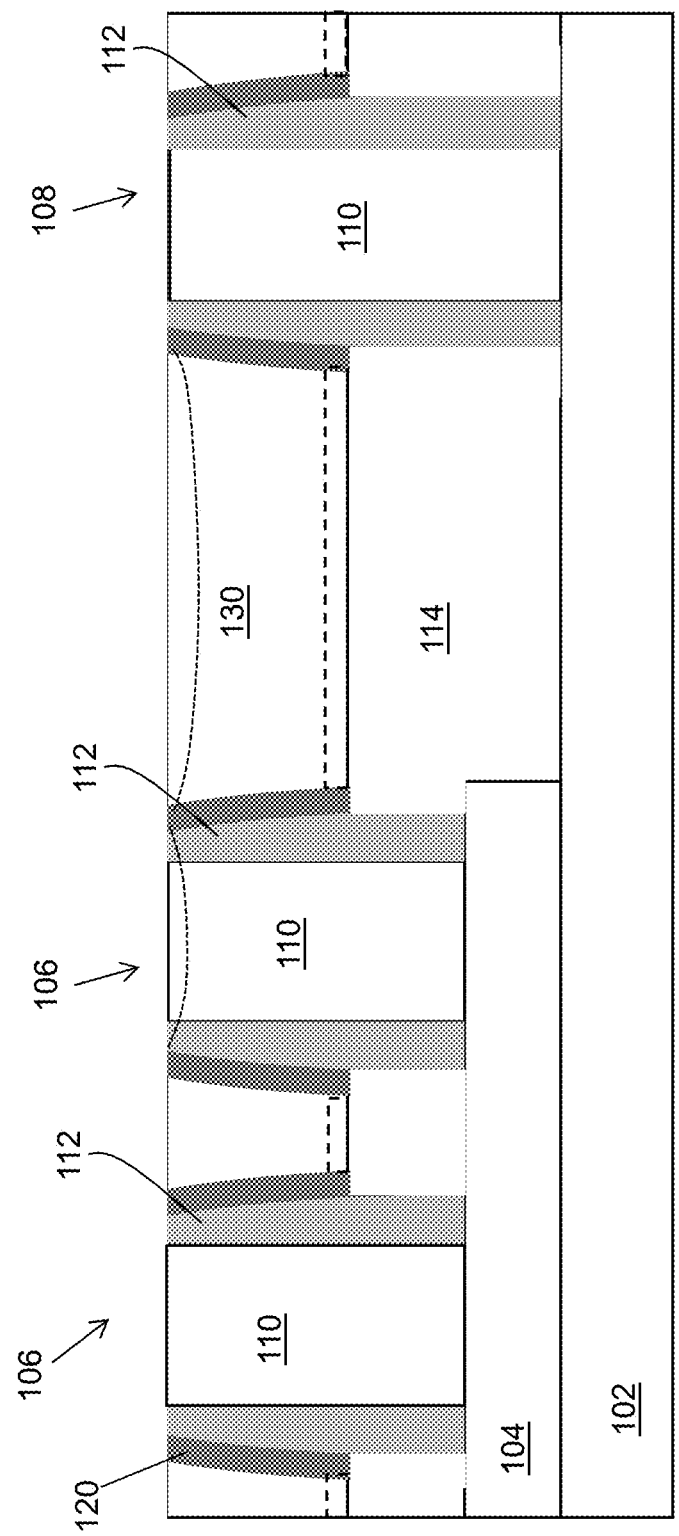

FIG. 4 shows forming another, second ILD layer 130 over liner 120. ILD layer 130 may be more resistant to polishing than ILD layer 114, which is now under liner 120. In this fashion, as shown in FIG. 5, rather than just using a softer ILD layer 114, a harder ILD layer 130 is employed such that dishing caused by subsequent polishing processing can be reduced and/or eliminated. That is, the ILD layer 130 is more polishing resistant and therefore polishing-caused dishing resistant than ILD layer 114, and thus may preserve gate height. In one example, where ILD layer 114 includes FCVD oxide, ILD layer 130 forming may include forming a high density plasma (HDP) oxide layer. However, ILD layer 130 may include any ILD material having sufficient hardness to resist dishing for whatever varied polishing parameters are selected, e.g., slurry type, slurry aggressiveness, etc. As shown in FIG. 5, polishing of ILD layer 130 along with the presence of liner 120 reduces and/or eliminates any dishing in gates 106, 108 or spacers 112. (In FIG. 5, the micro-dishing that is eliminated/reduced is shown in phantom in right-most gate 106, and macro-dishing that is eliminated/reduced is shown in phantom between right-most gate 106 and gate 108.)

Figure 6:
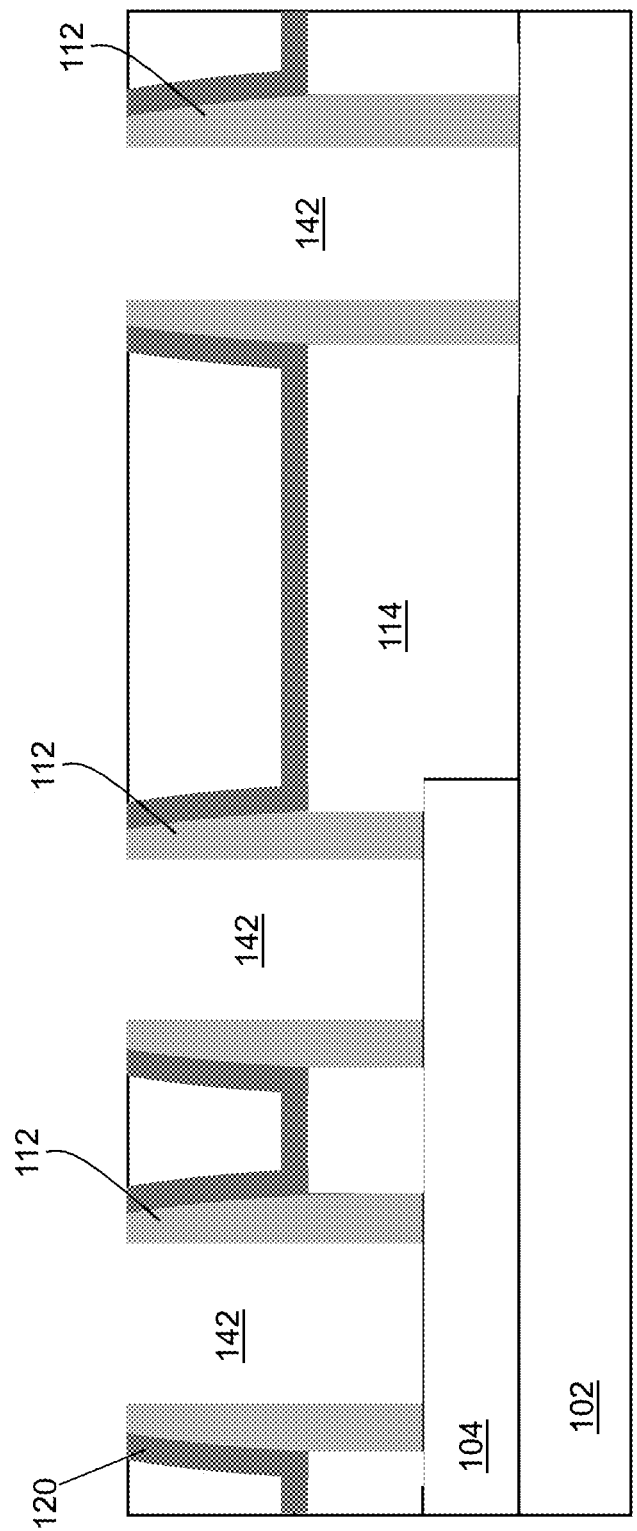
Figure 7:
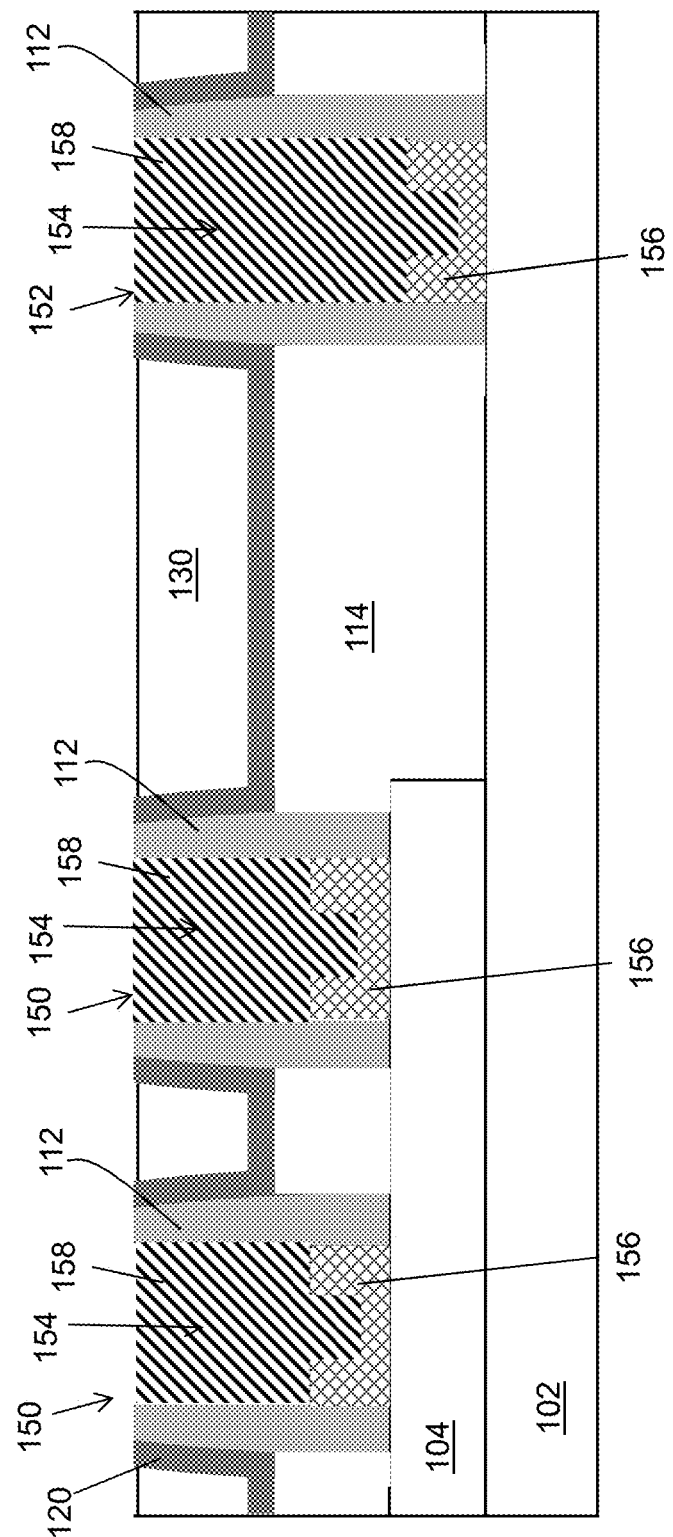

At this point, as shown in FIGS. 6 and 7, where gates 106, 108 (FIG. 5) are formed as dummy gates, the replacement metal processing can be carried out. That is, where gate(s) 106, 108 includes a dummy gate, the process may include removing the dummy gate, and forming a metal gate in place of the dummy gate. More specifically, as shown in FIG. 6, sacrificial material 110 (FIG. 5) of dummy gates 106, 108 (FIG. 5) may be removed, e.g., by an etch selective to sacrificial material 110, leaving open spaces 142. For example, where sacrificial material 110 includes polysilicon, the polysilicon removal may include, for example, a directional RIE combining with wet and non-directional RIE. FIG. 7 shows forming of a metal gate in place of the dummy gate. That is, forming metal gates 150 over fin(s) 114 and metal gate 152 directly over substrate 102. Gates 150, 152 may be formed by depositing a metal 154 and polishing to remove access metal. Metal 154 may include any now known or later developed gate metal such as but not limited to tungsten (W), titanium (Ti), tantalum (Ta), ruthenium (R), cobalt (C), copper (Cu), aluminum (Al), etc. As illustrated in FIG. 7, although not necessary in all cases, metal 154 may be formed in two parts, e.g., by a work function metal (WFM) 156 depositing, recessing, metal 158 depositing and then polishing. WFM 156 and metal 158 can be any of the listed metals 154, listed herein. As understood, any necessary liners (not shown) can be employed.

Figure 8:
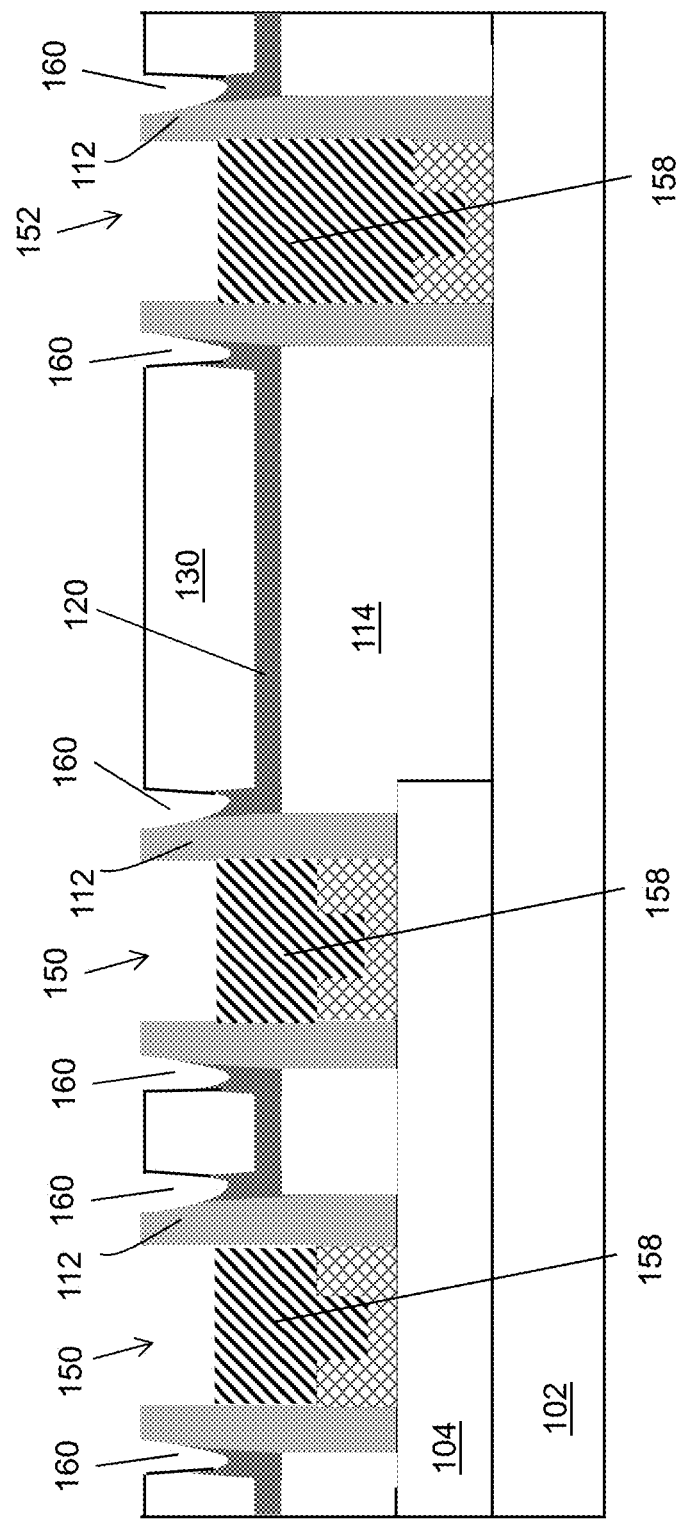

Regardless of whether gates 106, 108 are implemented as dummy gates (requiring RMG processing as shown in FIGS. 6-7) or gates 106, 108 are not replaced, as shown in FIG. 8, an upper portion of liner 120 adjacent spacer 112 is selectively removed, forming a void 160. The selective removal may be carried out by an etch selective to metal 158 (FIG. 7), liner 120 and ILD layer 130. Hence, metal 158 (FIG. 7), liner 120 and ILD layer 130 are all recessed. The etch may include, for example, reactive ion etch (RIE).

Figure 9:
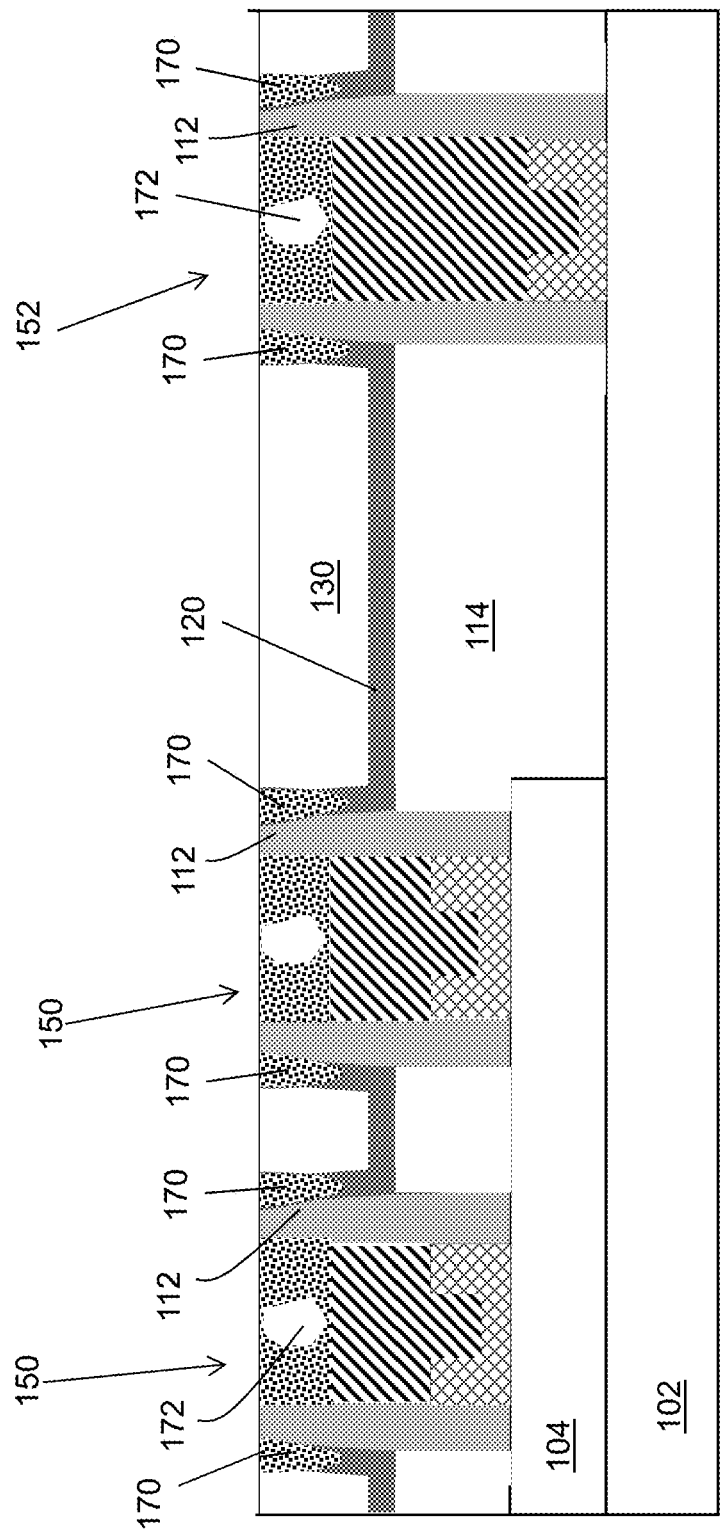

FIG. 9 shows forming a spacer extension 170 by filling void 160 with a spacer material. Spacer material may include any spacer material such as s SiBCN, SiOCN, SiCN, $Si_3N_4$, etc., each of which may, as lower k materials, reduce parasitic capacitance between gate and contact. Consequently, although not necessary, spacer 112 and spacer extension 170 may both include a nitride. As illustrated, the spacer material may also fill any recess over the gates 150, 152, although cavities 172 may be present therein. As will be illustrated, spacer extension 170 creates a ledge extending laterally from an upper portion of spacer 112 that acts to protect spacer 112 and gate 150, 152 from exposure during contact formation. Liner 120, where not removed, may extend below spacer extension 170. A polishing may be performed to remove access material, selective to ILD layer 130. As illustrated, spacer extension 170 creates a wider spacer with original spacer 112, which resists dishing therein (see phantom lines in FIG. 5), and preserves gate height. As apparent in FIG. 10, the polishing may open cavities 172.

Figure 10:
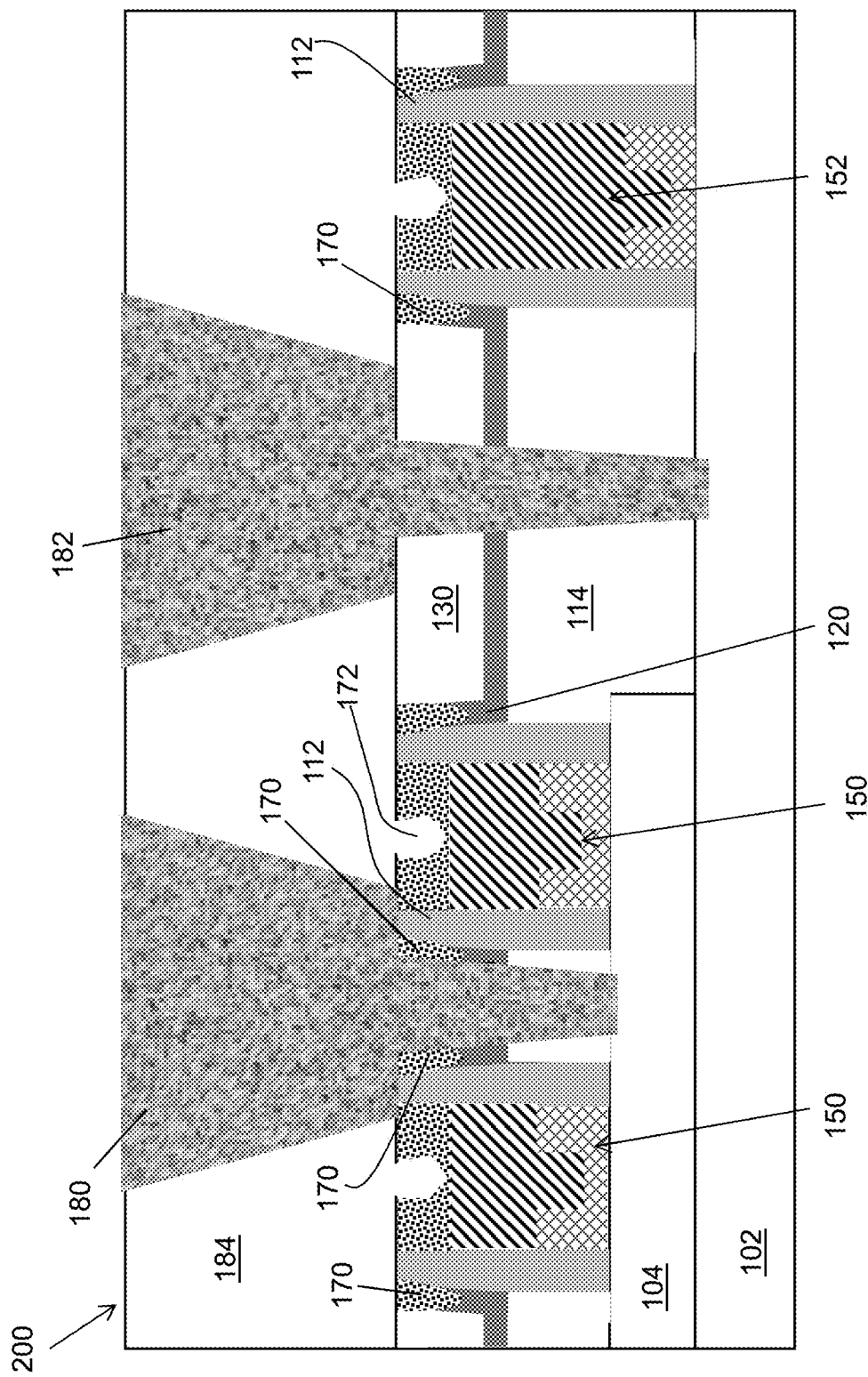
FIG. 10 shows a cross-section of a final step of the method and a semiconductor structure according to embodiments of the invention.

FIG. 10 shows forming a contact 180 self-aligned to spacer extension 170. Another contact 182 to substrate 102 may also be formed at the same time. Contacts 180, 182 may be formed using any now known or later developed techniques. For example, a third ILD layer 184 may be deposited. ILD layer 184 may include any of the dielectric materials listed herein, and may fill open cavities 172 (see FIG. 10). A mask (not shown) may be formed and contact openings etched, a refractory metal liner (not shown) may be deposited followed by a contact metal deposition such as tungsten, copper, aluminum, etc. A planarization may finish the processing. During contact open etching, spacer extension 170 protects portions of spacer 112 and gates 150, 152 from being removed, which would cause a short of the contacts to the gate.

FIG. 10 also illustrates a semiconductor structure 200 according to embodiments of the invention. Semiconductor structure 200 may include: a gate 150, 152 which may be a metal gate or, for example, a polysilicon gate. Although a wide variety of gate arrangements may be possible, the gate may include first gate(s) 150 positioned over fin 104 over substrate 102 and second gate(s) 152 positioned on substrate 102. Spacer 112 extends about gate 150, 152, and may include a nitride such as silicon nitride. Spacer extension 170 extends laterally from an upper portion of the spacer 112, i.e., as a ledge. Spacer 112 and spacer extension 170 may include a nitride such as silicon nitride. Liner 120, used to position spacer extension 170, extends below spacer extension 170. Liner 120 may extend laterally from spacer 112, or may be removed from doing so (see FIG. 5). Where present between gates, liner 120 may extend laterally from spacer 112 of one gate 150 to spacer 112 of another gate 150 or 152. Liner 120 may also extend laterally between ILD layer 114 and ILD layer 130, wherein ILD layer 130 is more polishing resistant than ILD layer 114. In one example, ILD layer 130 may include a high density plasma (HDP) oxide and ILD layer 114 may include a flowable chemical vapor deposition (FCVD) oxide layer. A contact 180 is self-aligned to spacer extension 170, as described herein.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A method of forming a contact, comprising:
 forming a liner against a spacer around a gate;
 selectively removing an upper portion of the liner adjacent the spacer, forming a void;
 forming a spacer extension by filling the void with a spacer material; and
 forming a contact self-aligned to the spacer extension.
2. The method of claim 1, wherein the liner extends over a first interlayer dielectric (ILD) layer, further comprising forming a second ILD layer over the liner, wherein the second ILD layer is more polishing resistant than the first ILD layer.
3. The method of claim 2, wherein forming the second ILD layer includes forming a high density plasma (HDP) oxide layer over the liner.
4. The method of claim 2, wherein forming the liner includes forming the liner between a plurality of gates over the first ILD layer.
5. The method of claim 1, wherein the liner includes one of a high dielectric constant dielectric and titanium nitride (TiN).

6. The method of claim 1, wherein the gate includes a dummy gate, further comprising, prior to the selective removing:
   removing the dummy gate; and
   forming a metal gate in place of the dummy gate.

7. A method, comprising:
   forming a liner against a spacer around a dummy gate;
   removing the dummy gate;
   forming a metal gate in place of the dummy gate;
   selectively removing an upper portion of the liner adjacent the spacer, forming a void;
   forming a spacer extension by filling the void with a spacer material; and
   forming a contact self-aligned to the spacer extension.

8. The method of claim 7, wherein the liner extends over a first interlayer dielectric (ILD) layer over a substrate, further comprising forming a second ILD layer over the liner, wherein the second ILD layer is more polishing resistant than the first ILD layer.

9. The method of claim 8, wherein the second ILD layer forming includes forming a high density plasma (HDP) oxide layer over the liner.

10. The method of claim 8, wherein the liner forming includes forming the liner between a plurality of gates over the first ILD layer.

11. The method of claim 7, wherein the liner includes one of a high dielectric constant dielectric and titanium nitride (TiN).

12. A semiconductor structure comprising:
   a gate;
   a spacer around the gate;
   a spacer extension extending laterally from an upper portion of the spacer;
   a contact self-aligned to the spacer extension, and
   a liner extending below the spacer extension.

13. The semiconductor structure of claim 12, wherein the liner extends laterally from the spacer.

14. The semiconductor structure of claim 13, further comprising a first interlayer dielectric (ILD) layer above a second ILD layer over a substrate, wherein the first ILD layer is more polishing resistant than the second ILD layer, and wherein the liner extends laterally between the first ILD layer and the second ILD layer.

15. The semiconductor structure of claim 14, wherein the first ILD layer includes a high density plasma (HDP) oxide and the second ILD layer includes a flowable chemical vapor deposition (FCVD) oxide layer.

16. The semiconductor structure of claim 12, wherein the gate includes a first gate positioned over a fin over a substrate and a second gate positioned on the substrate, and
   wherein the liner extends laterally from the spacer of the first gate to the spacer of the second gate.

17. The semiconductor structure of claim 12, wherein the spacer extension includes a ledge extending from the spacer.

18. The semiconductor structure of claim 12, wherein the spacer and the spacer extension include a nitride.

19. The semiconductor structure of claim 12, wherein the gate includes a metal gate.

* * * * *